(12) United States Patent
Shpunt et al.

(10) Patent No.: US 9,329,080 B2
(45) Date of Patent: May 3, 2016

(54) MODULAR OPTICS FOR SCANNING ENGINE HAVING BEAM COMBINING OPTICS WITH A PRISM INTERCEPTED BY BOTH BEAM AXIS AND COLLECTION AXIS

(71) Applicant: PrimeSense Ltd., Tel Aviv (IL)

(72) Inventors: Alexander Shpunt, Tel Aviv (IL); Benjamin Cohen, Jerusalem (IL)

(73) Assignee: APLLE INC., Cupertino, CA (US)

( * ) Notice: Subject to any disclaimer, the term of this patent is extended or adjusted under 35 U.S.C. 154(b) by 0 days.

(21) Appl. No.: 14/305,012

(22) Filed: Jun. 16, 2014

(65) Prior Publication Data

US 2014/0291496 A1     Oct. 2, 2014

Related U.S. Application Data

(63) Continuation-in-part of application No. 13/766,811, filed on Feb. 14, 2013, now Pat. No. 9,157,790.

(60) Provisional application No. 61/835,657, filed on Jun. 17, 2013, provisional application No. 61/598,921, filed on Feb. 15, 2012.

(51) Int. Cl.
  *G01J 1/04*      (2006.01)
  *G01J 1/42*      (2006.01)
  (Continued)

(52) U.S. Cl.
  CPC .............. *G01J 1/0477* (2013.01); *G01J 1/0429* (2013.01); *G01J 1/42* (2013.01); *H01S 5/02248* (2013.01); *H01S 5/005* (2013.01); *H01S 5/02292* (2013.01)

(58) Field of Classification Search
  CPC ....... G01J 1/0477; G02B 6/4292; G02B 6/42; G02B 6/4246
  USPC ............. 250/551, 216, 239, 227.11; 385/8, 9, 385/31, 33, 88–93; 372/11, 12, 101
  See application file for complete search history.

(56) References Cited

U.S. PATENT DOCUMENTS 3,401,590 A    9/1968   Gail et al.
5,606,181 A    2/1997   Sakuma et al.
(Continued)

FOREIGN PATENT DOCUMENTS

CN    1082228 A    2/1994
CN    1448000 A    10/2003
(Continued)

OTHER PUBLICATIONS

U.S. Appl. No. 14/231,764 Office Action dated Dec. 12, 2014.
(Continued)

*Primary Examiner* — Que T Le
(74) *Attorney, Agent, or Firm* — D. Kligler IP Services Ltd.

(57) ABSTRACT

An optoelectronic module includes a beam transmitter, which emits at least one beam of light along a beam axis, and a receiver, which senses the light received by the module along a collection axis of the receiver, which is parallel to the beam axis within the module. Beam-combining optics direct the beam and the received light so that the beam axis is aligned with the collection axis outside the module. The beam-combining optics include multiple faces, including at least a first face configured for internal reflection and a second face comprising a beamsplitter, which is intercepted by both the beam axis and the collection axis.

18 Claims, 4 Drawing Sheets

(51) Int. Cl.
*H01S 5/022* (2006.01)
*H01S 5/00* (2006.01)

(56) References Cited

U.S. PATENT DOCUMENTS

| | | | |
|---|---|---|---|
| 7,889,324 B2 * | 2/2011 | Yamamoto | G01C 3/08 356/3.01 |
| 7,936,450 B2 | 5/2011 | Hoersch et al. | |
| 7,952,781 B2 | 5/2011 | Weiss et al. | |
| 8,018,579 B1 | 9/2011 | Krah | |
| 8,319,172 B2 | 11/2012 | Klein et al. | |
| 2004/0063235 A1 | 4/2004 | Chang | |
| 2005/0178950 A1 | 8/2005 | Yoshida | |
| 2006/0001055 A1 | 1/2006 | Ueno et al. | |
| 2006/0252167 A1 | 11/2006 | Wang | |
| 2006/0252169 A1 | 11/2006 | Ashida | |
| 2011/0188054 A1 | 8/2011 | Petronius et al. | |
| 2011/0228251 A1 | 9/2011 | Yee et al. | |
| 2011/0279648 A1 | 11/2011 | Lutian et al. | |
| 2011/0310125 A1 | 12/2011 | McEldowney et al. | |
| 2012/0236379 A1 | 9/2012 | Da Silva et al. | |
| 2013/0206967 A1 | 8/2013 | Shpunt et al. | |
| 2013/0207970 A1 | 8/2013 | Shpunt et al. | |

FOREIGN PATENT DOCUMENTS

| | | |
|---|---|---|
| CN | 1890704 A | 1/2007 |
| CN | 1947254 A | 4/2007 |
| CN | 101390263 A | 3/2009 |
| EP | 2363686 A1 | 9/2011 |
| JP | 5211286 A1 | 1/1987 |
| WO | 2012020380 A1 | 2/2012 |
| WO | 2014016794 A1 | 1/2014 |

OTHER PUBLICATIONS

International Application # PCT/IB2014/062245 Search Report dated Dec. 3, 2014.

Minifaros, "D1.1-ProjectPresentation", V3.0, 36 pages, Dec. 22, 2010.

International Application # PCT/IB2013/051189 Search Report Dated Jun. 18, 2013.

Stone et al., "Performance Analysis of Next-Generation LADAR for Manufacturing, Construction, and Mobility", National Institute of Standards and Technology, document # NISTIR 7117, 198 pages, Gaithersburg, USA, May 2004.

U.S. Appl. No. 13/766,811 Office Action dated May 14, 2015.

European Application # 11150668.9 Office Action dated Oct. 12, 2015.

Chinese Application # 201410641036.8 Office Action dated Oct. 10, 2015.

* cited by examiner

MODULAR OPTICS FOR SCANNING ENGINE HAVING BEAM COMBINING OPTICS WITH A PRISM INTERCEPTED BY BOTH BEAM AXIS AND COLLECTION AXIS

CROSS-REFERENCE TO RELATED APPLICATION

This application claims the benefit of U.S. Provisional Patent Application 61/835,657, filed Jun. 17, 2013. This application is a continuation-in-part of U.S. patent application Ser. No. 13/766,811, filed Feb. 14, 2013, which claims the benefit of U.S. Provisional Patent Application 61/598,921, filed Feb. 15, 2012. All of these related applications are incorporated herein by reference.

FIELD OF THE INVENTION

The present invention relates generally to methods and devices for projection and capture of optical radiation, and particularly to optical scanning devices.

BACKGROUND

Various methods are known in the art for optical 3D mapping, i.e., generating a 3D profile of the surface of an object by processing an optical image of the object. This sort of 3D profile is also referred to as a 3D map, depth map or depth image, and 3D mapping is also referred to as depth mapping. The terms "optical" and "light," as used in the context of the present patent application and in the claims, refer to electromagnetic radiation in any or all of the visible, infrared and ultraviolet wavelength ranges.

U.S. Patent Application Publication 2011/0279648 describes a method for constructing a 3D representation of a subject, which comprises capturing, with a camera, a 2D image of the subject. The method further comprises scanning a modulated illumination beam over the subject to illuminate, one at a time, a plurality of target regions of the subject, and measuring a modulation aspect of light from the illumination beam reflected from each of the target regions. A moving-mirror beam scanner is used to scan the illumination beam, and a photodetector is used to measure the modulation aspect. The method further comprises computing a depth aspect based on the modulation aspect measured for each of the target regions, and associating the depth aspect with a corresponding pixel of the 2D image.

U.S. Pat. No. 8,018,579 describes a three-dimensional imaging and display system in which user input is optically detected in an imaging volume by measuring the path length of an amplitude modulated scanning beam as a function of the phase shift thereof. Visual image user feedback concerning the detected user input is presented.

U.S. Pat. No. 7,952,781, whose disclosure is incorporated herein by reference, describes a method of scanning a light beam and a method of manufacturing a microelectromechanical system (MEMS), which can be incorporated in a scanning device.

U.S. Patent Application Publication 2012/0236379 describes a LADAR system that uses MEMS scanning. A scanning mirror includes a substrate that is patterned to include a mirror area, a frame around the mirror area, and a base around the frame. A set of actuators operate to rotate the mirror area about a first axis relative to the frame, and a second set of actuators rotate the frame about a second axis relative to the base. The scanning mirror can be fabricated using semiconductor processing techniques. Drivers for the scanning mirror may employ feedback loops that operate the mirror for triangular motions. Some embodiments of the scanning mirror can be used in a LADAR system for a Natural User Interface of a computing system.

The "MiniFaros" consortium, coordinated by SICK AG (Hamburg, Germany) has supported work on a new laser scanner for automotive applications. Further details are available on the minifaros.eu Web site.

SUMMARY

Embodiments of the present invention that are described hereinbelow provide improved apparatus and methods for optical beam transmission and reception.

There is therefore provided, in accordance with an embodiment of the present invention, an optoelectronic module, including a beam transmitter, configured to emit at least one beam of light along a beam axis, and a receiver, configured to sense the light received by the module along a collection axis of the receiver, which is parallel to the beam axis within the module. Beam-combining optics, which are configured to direct the beam and the received light so that the beam axis is aligned with the collection axis outside the module, include multiple faces including at least a first face configured for internal reflection and a second face including a beamsplitter, which is intercepted by both the beam axis and the collection axis.

In some embodiments, the beam-combining optics include a prism having the multiple faces, wherein the beam axis enters and exits the faces of the prism at entrance and exit angles in a vicinity of a minimum deviation angle. In a disclosed embodiment, the first and second faces are parallel to one another, and both the beam axis and the collection axis pass through the second face at different, respective locations.

In a disclosed embodiment, the module includes a micro-optical substrate, and the beam transmitter includes a laser die, while the receiver includes a detector die, both of which are mounted on the micro-optical substrate.

In some embodiments, the module includes a filter formed on one of the faces so as to exclude the received light that is outside an emission band of the beam transmitter. Additionally or alternatively, the beamsplitter includes a polarizing beamsplitter coating on the second face. The beam-combining optics may include at least one lens, which is configured to collimate the at least one laser beam and to focus the received light onto the detector die.

In one embodiment, the multiple faces include a third face through which the beam axis and the collection axis exit the module at a location on the third face that is common to both the beam axis and the collection axis.

In a disclosed embodiment, an optical scanning head, includes the module described above and a scanning mirror, which is configured to scan both the beam axis and the collection axis together over a scan area.

There is also provided, in accordance with an embodiment of the present invention, an optical method, which includes emitting at least one beam of light toward a scanner along a beam axis from a beam transmitter in an optoelectronic module. The light is received from the scanner along a collection axis, which is parallel to the beam axis within the optoelectronic module. The beam and the received light are directed to and from the scanner so that the beam axis is aligned with the collection axis at the scanner, using beam-combining optics including multiple faces including at least a first face configured for internal reflection and a second face including a beamsplitter, which is intercepted by both the beam axis and the collection axis.

In a disclosed embodiment, the method includes scanning both the beam axis and the collection axis together over a scan area using the scanner, wherein emitting the at least one beam includes emitting pulses of the light, and wherein receiving the light includes measuring respective times of flight of the pulses to and from objects in the scan area.

The present invention will be more fully understood from the following detailed description of the embodiments thereof, taken together with the drawings in which:

DETAILED DESCRIPTION OF EMBODIMENTS

The above-mentioned U.S. patent application Ser. No. 13/766,811 (published Aug. 15, 2013, as US 2013/0206967) describes depth engines that generate 3D mapping data by measuring the time of flight of a scanning beam. A light transmitter, such as a laser, directs short pulses of light toward a scanning mirror, which scans the light beam over a scene of interest. A receiver, such as a sensitive, high-speed photodiode (for example, an avalanche photodiode) receives light returned from the scene via the same scanning mirror. Processing circuitry measures the time delay between the transmitted and received light pulses at each point in the scan. This delay is indicative of the distance traveled by the light beam, and hence of the depth of the object at the point. The processing circuitry uses the depth data thus extracted in producing a 3D map of the scene.

Various possible configurations of depth engine optics are described in U.S. patent application Ser. No. 13/766,811. A number of the disclosed embodiments use a single scanning mirror to transmit the beam output by the transmitter and to direct the light returned (typically by reflection) toward the receiver. The depth engine optics therefore include beam-combining optics, which direct the output beam and the received light so that the beam axis of the output beam is aligned with the collection axis of the received beam. The beam-combining optics typically comprise multiple surfaces, with functions of beamsplitting, beam turning, and wavelength filtering, for example. In general, careful alignment of the optical surfaces, along with the transmitter, receiver and scanning mirror themselves, is needed to ensure proper operation of the depth engine; and deviations in alignment in the course of operation of the depth engine can lead to a serious loss of performance.

Embodiments of the present invention that are described hereinbelow build on the optoelectronic modules and beam-combining optics that are described in U.S. patent application Ser. No. 13/766,811 and add features that enhance the ease of alignment and robustness of such modules. In these embodiments, an optoelectronic module comprises a beam transmitter, which emits at least one laser beam along a beam axis, and a receiver, which senses light received by the module along a collection axis. The beam axis and collection axis are separate and parallel within the module. Beam-combining optics direct both the beam and the received light so that outside the module, the beam axis is aligned with the collection axis outside the module (and thus the same scanning mirror can be used to scan both the beam axis and the collection axis together over a given scan area).

In the disclosed embodiments, the beam combining optics comprise an element, such as a prism, with multiple faces. One face is configured for internal reflection, to enable the beam and collection axes to be aligned by reflection of one of the axes within the element, as shown in the figures. A second face of the element comprises a beamsplitter, which is intercepted by both the beam axis and the collection axis. The beam-combining prism may be designed and positioned so that the beam axis enters and exits the faces of the prism at entrance and exit angles in a vicinity of the minimum deviation angle, as defined below. This feature of the prism facilitates alignment of the beams and enhances the robustness of the module against possible deviations of the alignment during use.

Figure 1:
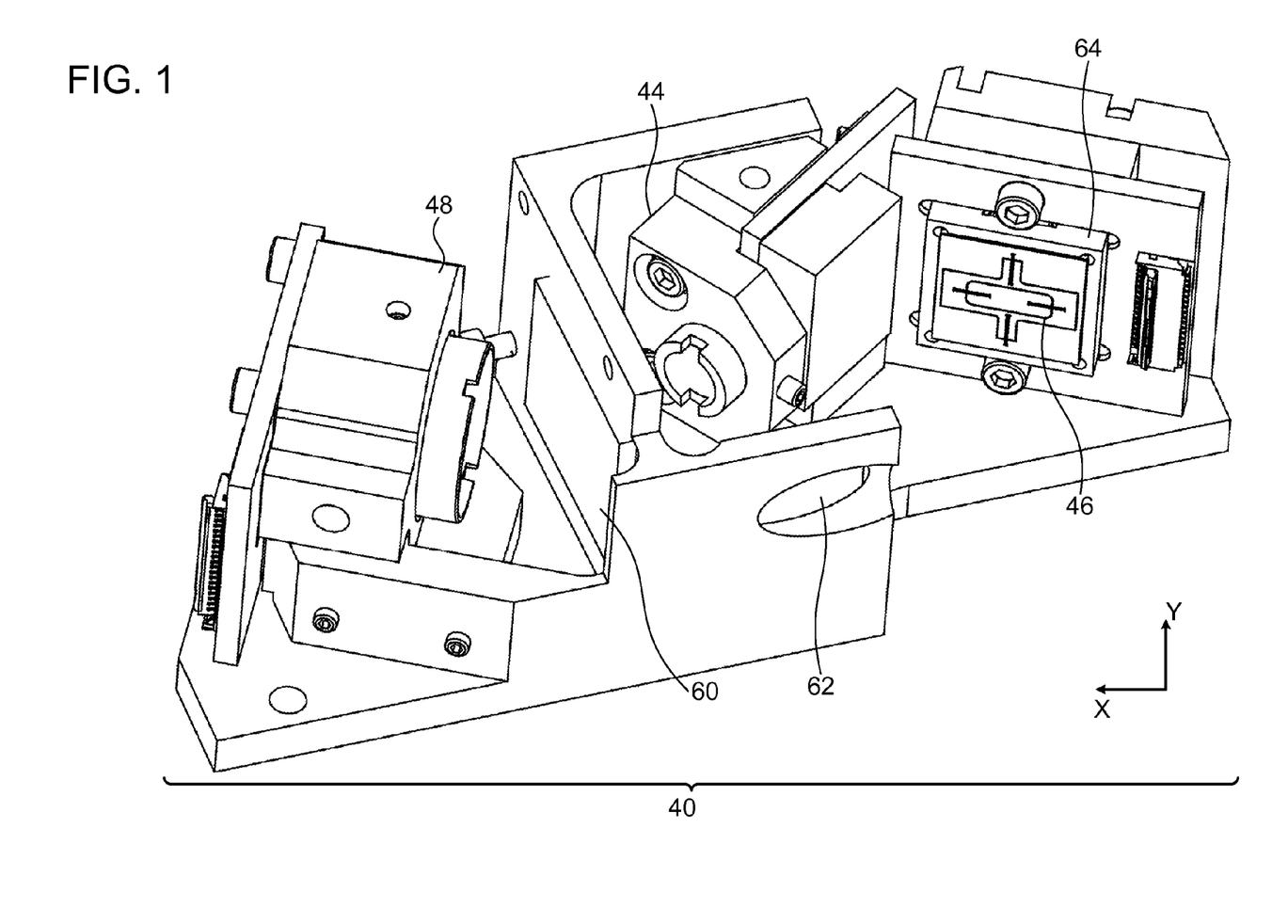
FIG. 1 is a schematic, pictorial illustration of an optical scanning head, in accordance with an embodiment of the present invention.
Figure 3A:
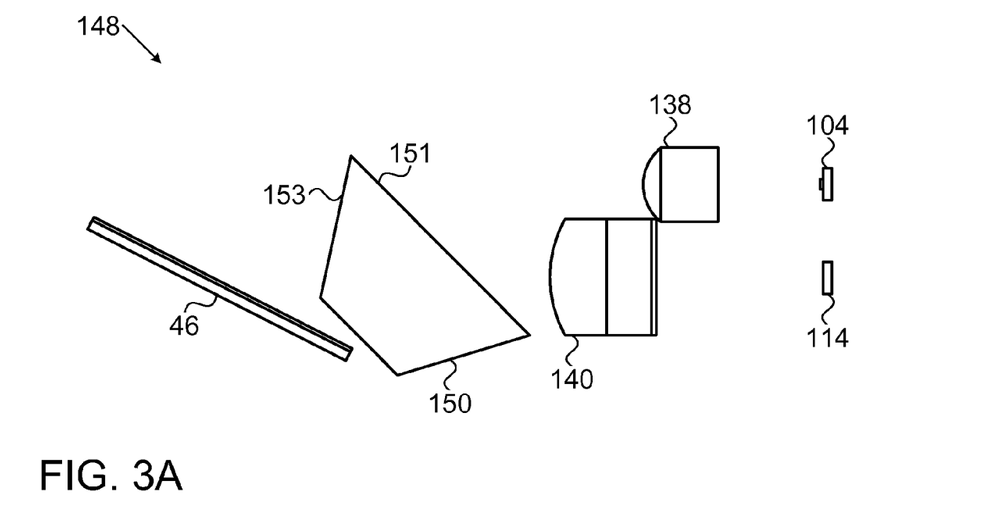
FIG. 3A is a schematic side view of an optoelectronic module, in accordance with an embodiment of the present invention.
Figure 3B:
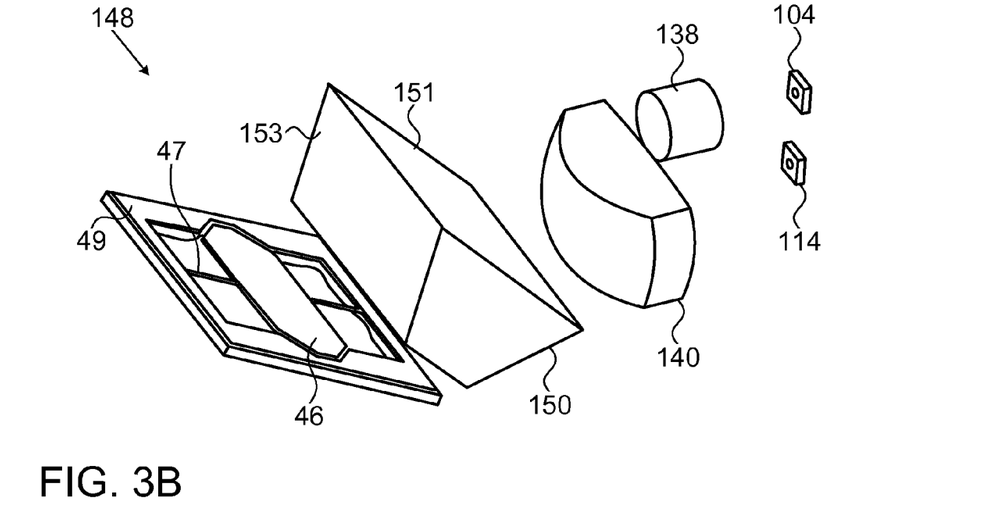
FIG. 3B is a schematic, isometric view of the module of FIG. 3A.
Figure 4:
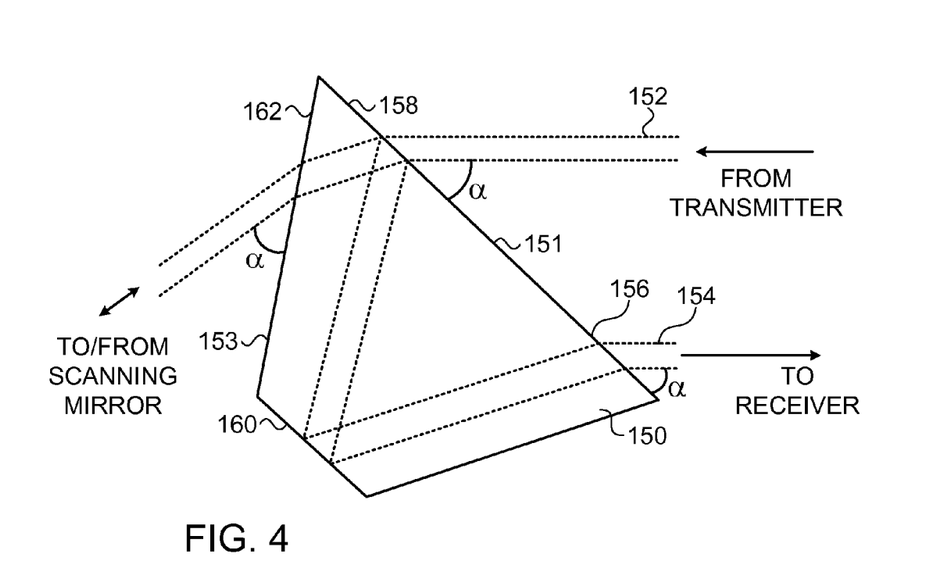
FIG. 4 is a schematic side view of a prism, in accordance with an embodiment of the present invention.
Figure 5:
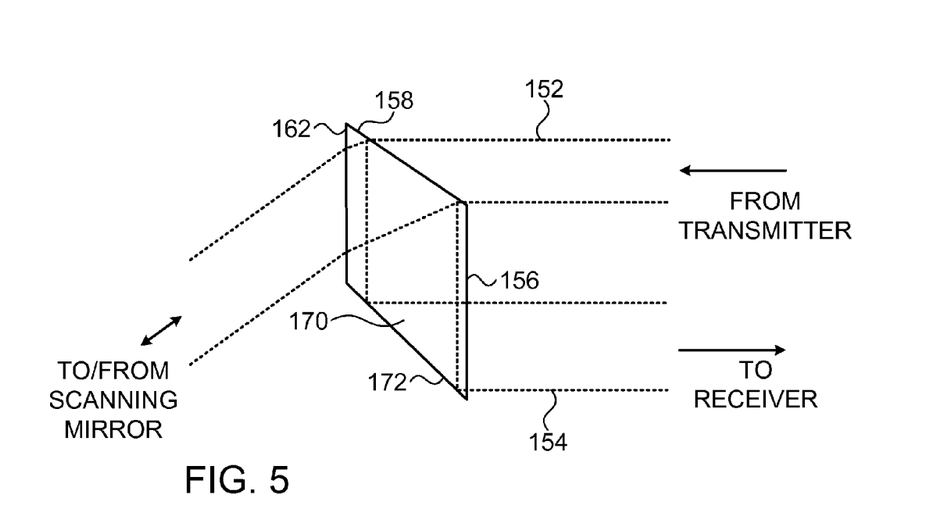
FIG. 5 is a schematic side view of a prism, in accordance with another embodiment of the present invention.

FIG. 1 schematically illustrates elements of an optical scanning head 40 that is used in the system described in the above-mentioned U.S. patent application Ser. No. 13/766,811. Optical scanning head 40 is shown and described here as an illustration of the principles of a particular scanner in which embodiments of the present invention may be applied. This optical scanning head contains numerous optical components, which must generally be carefully aligned for proper operation; and these components may desirably be replaced by the sort of elements that are shown in FIGS. 3-5 and described hereinbelow.

The principles of the present invention are not limited to scanners of this type, however. Rather, optoelectronic modules and beam-combining optics based on these principles may be applied in other sorts of optical transmitter/receiver devices having boresighted (or otherwise parallel) axes of transmission and reception.

A transmitter 44 in head 40 emits pulses of light toward a polarizing beamsplitter 60. Typically, only a small area of the beamsplitter, directly in the light path of transmitter 44, is coated for reflection, while the remainder of the beamsplitter is fully transparent in the transmitted wavelength range (or even anti-reflection coated for this range) to permit returned light to pass through to a receiver 48. The light from transmitter 44 reflects off beamsplitter 60 and then a folding mirror 62 toward a scanning micromirror 46. A MEMS scanner 64 scans the micromirror in X- and Y-directions with the desired scan frequency and amplitude. Details of the micromirror and scanner are described in U.S. patent application Ser. No. 13/766,811 and are beyond the scope of the present patent application.

Light pulses returned from the scene strike micromirror 46, which reflects the light via folding mirror 62 through beamsplitter 60. Receiver 48 senses the returned light pulses and generates corresponding electrical pulses. To enhance sensitivity of detection, the overall area of beamsplitter 60 and the aperture of receiver 48 may be considerably larger than the area of the beam that is output by transmitter 44. To limit the amount of unwanted ambient light that reaches receiver 48, a bandpass filter (not shown in this figure) may be incorporated in the receiver path, possibly on the same substrate as beamsplitter 60.

Figure 2A:
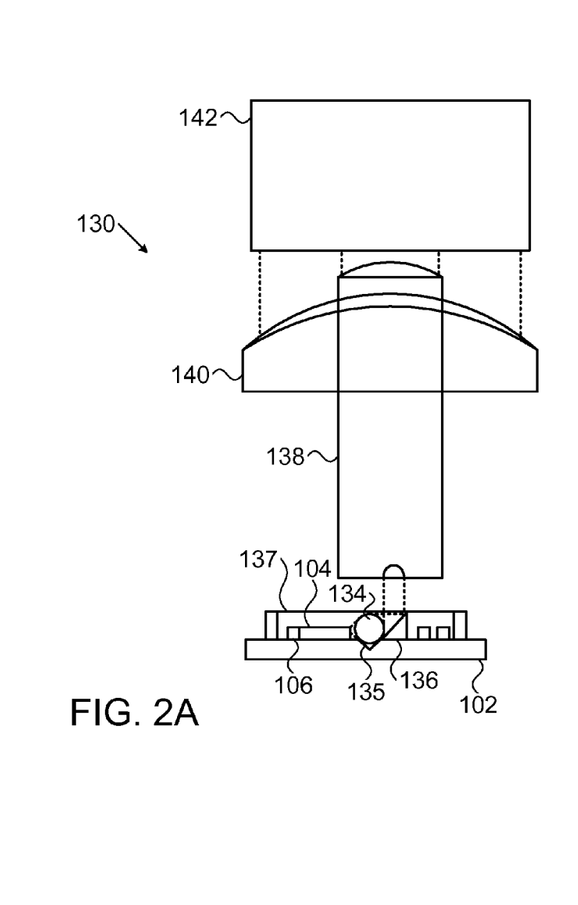
FIGS. 2A and 2B are schematic side views of an optoelectronic module, in accordance with yet another embodiment of the present invention.
Figure 2B:
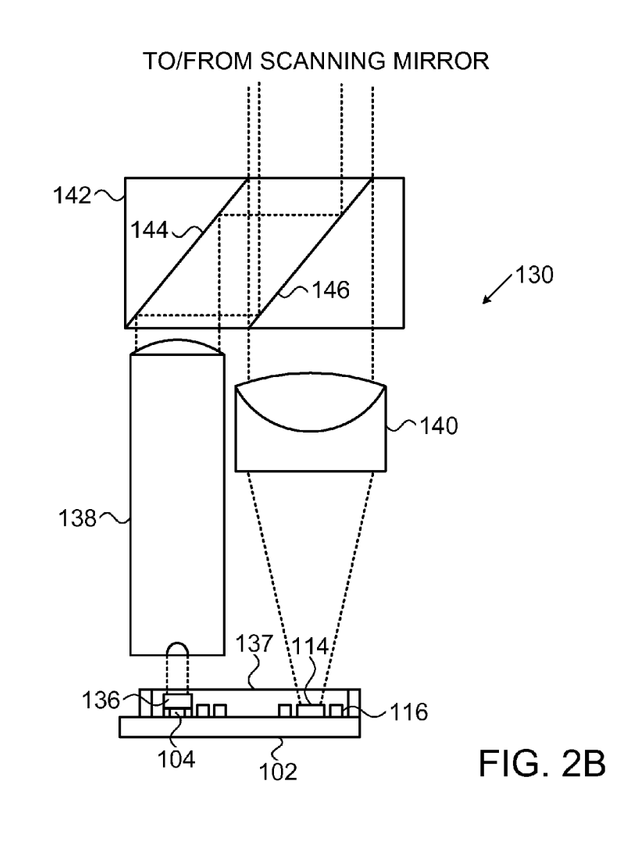

FIGS. 2A and 2B are schematic side views of an optoelectronic module 130, in accordance with another embodiment described in the above-mentioned U.S. patent application Ser. No. 13/766,811. Module 130 may take the place of transmitter 44, receiver 48, beamsplitter 60 and mirror 62 in optical scanning head 40 (FIG. 1). The view shown in FIG. 2B is rotated by 90° relative to that in FIG. 2A, so that items that are seen at the front of the view of FIG. 2A are on the left side of FIG. 2B.

In module 130, the transmitted beam is generated by a laser die 104, while the received beam is sensed by an avalanche photodiode (APD) 114, both mounted on a common micro-optical substrate, typically a silicon optical bench (SiOB) 102. Alternatively, the laser die may be integrated on the SiOB as a transmitter module, while the APD is mounted on a printed circuit board along with the transmitter module. Although laser die 104 is shown in the figures as an edge-emitting device, in alternative embodiments (not shown in the figures), the transmitter may comprise one or more surface-emitting devices, such as a vertical-cavity surface-emitting laser (VCSEL). These aspects of the configuration of module 130 are shown and described here, however, solely by way of example, and the principles of the present invention, as explained below, are similarly applicable to a wide range of different transmitter/receiver designs.

The transmitted and received beams are separate within module 130 and are aligned at the exit from the module by a beam combiner 142 mounted over the substrate of the module. The embodiments shown in FIGS. 3-5 may use similar sorts of transmitters and receivers, but provide improved beam combiners. Alternatively, the beam combiners shown in FIGS. 3-5 may be used with optical transmitters and receivers of other sorts.

The illumination beam emitted by laser die 104 is collimated by a ball lens 134, which is positioned in a groove 135 formed in SiOB 102. Groove 135 may be produced in silicon (and other semiconductor materials) with lithographic precision by techniques that are known in the art, such as wet etching. Alternatively or additionally, the ball lens may be attached directly to SiOB by an accurate pick-and-place machine, even without groove 135. A turning mirror 136 reflects the collimated beam away from SiOB 102 and through a cover glass 137, which protects the optoelectronic components in module 130. Associate electronic components, such as a laser driver 106 and an amplifier 116 coupled to APD 114, may also be mounted on SiOB 102.

As ball lens 134 typically achieves only partial collimation, a beam expander 138 may be used to expand the laser beam, typically by a factor of three to ten, and thus enhance its collimation. Although beam expander 138 is shown here as a single-element optical component, multi-element beam expanders may alternatively be used.

The collimated beam that is output by beam expander 138 is turned by a reflector 144 in beam combiner 142, and is then turned back outward toward the scanning mirror by a beamsplitter 146. Assuming laser die 104 to output a polarized beam, beamsplitter 146 may advantageously be polarization-dependent, with opposite polarizations for the transmitted and received beams. The collected beam returned from the scanning mirror passes through beamsplitter 146 and is then focused onto APD 114 by a collection lens 140. The collection lens may optionally have an asymmetrical, elongated shape, as shown in FIGS. 2A and 2B, in order to maximize light collection efficiency within the geometrical constraints of module 130. (In the present case, the aperture of collection lens 140 is chosen to accept all rays from the scene that are reflected by micromirror 46, with certain tolerances, and the elongated shape of the lens matches the elongated shape of the mirror.)

FIGS. 3A and 3B schematically illustrate an optoelectronic module 148, in accordance with an embodiment of the present invention. FIG. 3A shows a side view, while FIG. 3B shows an isometric view of the same elements. Module 148 may be used in place of module 130 in optical scanning head 40, as well as in optical apparatus of other types. Elements of module 148 that are similar in function to the elements of optical scanning head 40 and module 130, as described above, are identified by the same numbers as above and may be implemented in similar fashion, mutatis mutandis. In contrast to module 130, however, the beam-combining optics in module 148 comprise a novel sort of prism 150, which comprises a rear face 151 (facing toward the transmitter and receiver) and a front face 153 (facing toward micromirror 46). The transmitted beam enters the prism through face 151 and exits through face 153 toward micromirror 46, while the received beam reflected from the micromirror enters the prism through face 153 and exits through face 151 (as marked in FIG. 4). Micromirror 46 is mounted to rotate around hinges 47 relative to a base 49, and thus scans both the transmitted and received beams simultaneously over a scan area.

Prism 150 is configured and aligned so that the beam axis of the transmitted beam is aligned with the collection axis of the received beam outside module 148, while the beam axis and the collection axis both enter and exit the faces of the prism at roughly half the minimum deviation angle of the prism. The minimum deviation angle, as is known in the art, is the angle D that satisfies the relation: $\sin((A+D)/2) = n\sin(A/2)$, wherein A is the angle of the prism (in this case the angle of the upper apex of the prism in FIG. 3A), n is the refractive index of the prism, and D is the angle of deviation of the beam transmitted through the prism relative to the incident beam.

For various design reasons, however, such as compactness and manufacturability, prism 150 may intentionally deviate from the precise minimum deviation angle. The beneficial effects of this sort of minimum-deviation design can still be appreciated even for deviations up to about ±15° from the minimum-deviation point. Beam angles within this ±15° angular range are defined herein as being in the vicinity of the minimum deviation angle, and transmitter/receiver module designs in accordance with some embodiments of the present invention may take advantage of refraction and internal reflection within a prism as long as the beam axis enters and exits the faces of the prism at entrance and exit angles in such a vicinity of the minimum-deviation criterion.

FIG. 4 is a schematic side view of prism 150, in accordance with an embodiment of the present invention. A transmitted beam 152 enters rear face 151 and exits front face 153 at an angle α relative to each face, wherein the deviation angle $D = 180 - 2\alpha - A$. A received beam 154 likewise enters face 153 and exits rear face 151 at the same angle α. The beam axis of transmitted beam 152 and the collection axis of received beam 154 pass through front face 153 at the same location, common to both beams; while the collection axis passes through rear face 151 at a location different from the entry point of the beam axis of transmitted beam 152 through the rear face. (The beam axis and collection axis of the module are parallel to beam 152 and beam 154, respectively.) The received beam reflects internally from a beam-turning face 160, which is parallel to face 151.

For proper performance of prism 150, suitable coatings are typically applied to the faces of the prism. Face 151 has a beamsplitter coating 158, typically a polarizing beamsplitter coating, in the area where beam 152 enters prism 150, while face 153 typically has an anti-reflection coating 162 in the area where beam 152 exits the prism and beam 154 enters. Beam-turning face 160 has a reflective coating (which may be metal or dielectric) for reflecting received beam 154 within prism 150. Face 151 may have a narrowband filter coating 156 in the area through which the received beam exits prism 150 toward the receiver, with a passband matched to the emission band of the transmitter, as explained in U.S. patent application Ser. No. 13/766,811. The remaining areas of the faces of prism 150 may be coated with a light-absorbing coating in order to reduce the amount of stray light reaching the receiver.

The design of prism 150 makes module 148 simple to align and tolerant of deviations in alignment. Even if the prism is rotated by several degrees, beams 152 and 154 will maintain their alignment at front face 153 with one another and with micromirror 46. Specifically, because of the minimum deviation criterion, if the prism is rotated by a small angle Δ about an axis passing through the page of FIG. 4, the angle between beams 152 and 154 and face 151 will increase to α+Δ, while the angle between the beams and face 153 will decrease to α−Δ, or vice versa, so that the total deviation angle remains the same. Because face 160 is parallel to face 151, the alignment between the two beams is maintained notwithstanding the rotation. Thus, a scanner containing module 148 can be assembled at low cost and will be robust against shocks and changing thermal conditions in the field.

Prism 150 can be mass-produced readily from an optical glass plate of appropriate thickness (for example, 2-10 mm thick, dependent on application requirements). Before cutting the plate, coatings 156 and 158 are applied at the appropriate locations on the side of the plate that will become face 151, and a reflective coating is applied to the opposite side, which will become face 160. The plate is then cut and polished at the appropriate angle to define face 153, to which coating 162 is then applied. The other, non-functional faces are cut in order to singulate prism 150 only after the coating processes have been completed.

FIG. 5 is a schematic side view of a prism 170 in accordance with an alternative embodiment of the present invention. The coatings of the prism faces in this embodiment are identified using the same numbers as in FIG. 4. As in prism 150, the transmitted beam passes through prism 170 near (though in this case not precisely at) the minimum deviation angle. The received beam at prism 170, however, is turned by beamsplitter coating 158 and then by total internal reflection at a turning face 172 of prism 170, before exiting the prism through a different surface from the entry surface of the transmitted beam. Because the minimum deviation criterion is partly relaxed in the design of prism 170, this design is less tolerant of misalignment than prism 150, but this sort of relaxation may be advantageous in applications in which physical compactness is at a premium or other design considerations come into play.

Alternative implementations of the principles set forth above will be apparent to those skilled in the art after reading the present disclosure and are considered to be within the scope of the present invention. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic module, comprising:
   a beam transmitter, configured to emit at least one beam of light along a beam axis;
   a receiver, configured to sense the light received by the module along a collection axis of the receiver, which is parallel to the beam axis within the module; and
   beam-combining optics, configured to direct the beam and the received light so that the beam axis is aligned with the collection axis outside the module, and comprising a prism having multiple faces including at least a first face configured for internal reflection and a second face comprising a beamsplitter, which is intercepted by both the beam axis and the collection axis,
   wherein the beam axis enters and exits the faces of the prism at entrance and exit angles in a vicinity of a minimum deviation angle.

2. The module according to claim 1, wherein the first and second faces are parallel to one another.

3. The module according to claim 1, wherein both the beam axis and the collection axis pass through the second face at different, respective locations.

4. The module according to claim 1, and comprising a micro-optical substrate, wherein the beam transmitter comprises a laser die, and the receiver comprises a detector die, both of which are mounted on the micro-optical substrate.

5. The module according to claim 1, and comprising a filter formed on one of the faces so as to exclude the received light that is outside an emission band of the beam transmitter.

6. The module according to claim 1, wherein the beamsplitter comprises a polarizing beamsplitter coating on the second face.

7. The module according to claim 1, wherein the multiple faces comprise a third face through which the beam axis and the collection axis exit the module at a location on the third face that is common to both the beam axis and the collection axis.

8. The module according to claim 1, wherein the beam-combining optics comprise at least one lens, which is configured to collimate the at least one laser beam and to focus the received light onto the detector die.

9. An optical scanning head, which comprises the module according to claim 1 and a scanning mirror, which is configured to scan both the beam axis and the collection axis together over a scan area.

10. An optical method, comprising:
    emitting at least one beam of light toward a scanner along a beam axis from a beam transmitter in an optoelectronic module;
    receiving the light from the scanner along a collection axis, which is parallel to the beam axis within the optoelectronic module; and
    directing the beam and the received light to and from the scanner so that the beam axis is aligned with the collection axis at the scanner, using beam-combining optics comprising a prism having multiple faces including at least a first face configured for internal reflection and a second face comprising a beamsplitter, which is intercepted by both the beam axis and the collection axis,
    wherein the beam axis enters and exits the faces of the prism at entrance and exit angles in a vicinity of a minimum deviation angle.

11. The method according to claim 10, wherein the first and second faces are parallel to one another.

12. The method according to claim 10, wherein both the beam axis and the collection axis pass through the second face at different, respective locations.

13. The method according to claim 10, and comprising forming a filter on one of the faces so as to exclude the received light that is outside an emission band of the beam transmitter.

14. The method according to claim 10, wherein the beamsplitter comprises a polarizing beamsplitter coating on the second face.

15. The method according to claim 10, wherein the multiple faces comprise a third face through which the beam axis and the collection axis exit the optoelectronic module at a location on the third face that is common to both the beam axis and the collection axis.

16. The method according to claim 10, wherein directing the laser beam and the received light comprises applying at least one lens to collimate the at least one laser beam and to focus the light received from the scanner.

17. The method according to claim 10, and comprising scanning both the beam axis and the collection axis together over a scan area using the scanner.

18. The method according to claim 17, wherein emitting the at least one beam comprises emitting pulses of the light, and wherein receiving the light comprises measuring respective times of flight of the pulses to and from objects in the scan area.

* * * * *